(12) United States Patent
Sakata

(10) Patent No.: US 12,374,654 B2
(45) Date of Patent: Jul. 29, 2025

(54) DEVICE MANUFACTURING METHOD AND LIGHT EMITTING DEVICE

(71) Applicant: NICHIA CORPORATION, Anan (JP)

(72) Inventor: Tomokazu Sakata, Anan (JP)

(73) Assignee: NICHIA CORPORATION, Anan (JP)

( * ) Notice: Subject to any disclaimer, the term of this patent is extended or adjusted under 35 U.S.C. 154(b) by 726 days.

(21) Appl. No.: 17/455,402

(22) Filed: Nov. 17, 2021

(65) Prior Publication Data

US 2022/0165704 A1    May 26, 2022

(30) Foreign Application Priority Data

Nov. 20, 2020 (JP) ................. 2020-192985

(51) Int. Cl.
*H01L 23/00* (2006.01)
*H10H 20/01* (2025.01)
*H10H 20/857* (2025.01)

(52) U.S. Cl.
CPC .............. *H01L 24/92* (2013.01); *H01L 24/73* (2013.01); *H10H 20/01* (2025.01); *H10H 20/857* (2025.01)

(58) Field of Classification Search
CPC ....... H01L 24/92; H01L 24/73; H01L 33/005; H01L 33/62; H01L 24/29; H01L 24/32; H01L 2224/27312; H01L 2224/29016; H01L 2224/29019; H01L 2224/32057; H01L 24/27; H01L 24/743; H01L 24/83; H01L 2224/0603; H01L 2224/32013; H01L 2224/32058; H01L 2224/32225; H01L 2224/48137; H01L 2224/49175; H01L 2224/73265; H01L 2224/743; H01L 2224/83192; H01L 2224/83201; H01L 2924/00014; H01L 33/0095; H01L 2933/0066; H01L 2924/00012; H10H 20/01; H10H 20/857; H10H 20/0364
See application file for complete search history.

(56) References Cited

U.S. PATENT DOCUMENTS

| | | | |
|---|---|---|---|
| 2013/0009300 A1* | 1/2013 | Yato | H01L 24/49 257/676 |
| 2014/0321491 A1* | 10/2014 | Sakata | H01S 5/02469 438/46 |
| 2023/0361006 A1* | 11/2023 | Yaginuma | H01L 23/49513 |

FOREIGN PATENT DOCUMENTS

| | | |
|---|---|---|
| JP | S58-081073 U | 6/1983 |
| JP | S58-146570 U | 10/1983 |

(Continued)

*Primary Examiner* — Jonathan Han
(74) *Attorney, Agent, or Firm* — Global IP Counselors, LLP

(57) ABSTRACT

A device manufacturing method includes: applying a bonding material in a predetermined position on a mounting face of a base by dispensing the bonding material through a nozzle of a bonding machine, in which an outline of a leading end face of the nozzle defines an area of at least 75% of a bonding face of a component to be mounted, so that the bonding material applied onto the mounting face has an outline that at least partially extends beyond a shape of the bonding face; and bonding the bonding face in the predetermined position on the mounting face by placing and pressing the component onto the base via the bonding material so that at least a portion of the bonding material interposed between the mounting face of the base and the bonding face of the component flows out beyond the bonding face of the component.

3 Claims, 14 Drawing Sheets

(56) References Cited

FOREIGN PATENT DOCUMENTS

| | | |
|---|---|---|
| JP | S61-177731 A | 8/1986 |
| JP | H03-101863 A | 4/1991 |
| JP | H06-132328 A | 5/1994 |
| JP | H08-281175 A | 10/1996 |
| JP | H11-233533 A | 8/1999 |
| JP | H11-312696 A | 11/1999 |
| JP | 2000-271521 A | 10/2000 |
| JP | 2005-313087 A | 11/2005 |
| JP | 2008-028300 A | 2/2008 |
| JP | 2010-086997 A | 4/2010 |
| JP | 2012-028443 A | 2/2012 |
| WO | 2011/121756 A1 | 10/2011 |

* cited by examiner

DEVICE MANUFACTURING METHOD AND LIGHT EMITTING DEVICE

CROSS-REFERENCE TO RELATED APPLICATION

This application claims priority to Japanese Patent Application No. 2020-192985, filed on Nov. 20, 2020, the disclosure of which is hereby incorporated by reference in its entirety.

BACKGROUND

The present disclosure relates to a method of manufacturing a device such as a light emitting device, or a light emitting device.

For example, a bonding material is used to fix a semiconductor chip to a base in a predetermined position. PCT Publication No. WO 2011/121756 discloses a method of transferring a paste bonding material that can make the coating thickness smaller than the thickness of a semiconductor chip by taking the phenomenon into consideration in which a bonding material creeps onto the upper face of the semiconductor chip.

SUMMARY

There is still room for improvement in a method of stably bonding a component such as a semiconductor chip.

A device manufacturing method disclosed in certain embodiment of the present disclosure includes: applying a bonding material in a predetermined position on a mounting face of a base by dispensing the bonding material through a nozzle of a bonding machine, in which an outline of a leading end face of the nozzle defines an area of at least 75% of a bonding face of a component to be mounted, so that the bonding material applied onto the mounting face has an outline that at least partially extends beyond a shape of the bonding face of the component; and bonding the bonding face of the component in the predetermined position on the mounting face of the base by placing and pressing the component onto the base via the bonding material so that at least a portion of the bonding material interposed between the mounting face of the base and the bonding face of the component flows out beyond the bonding face of the component.

A light emitting device disclosed in certain embodiment of the present disclosure includes a base, a submount mounted on the base and having a thickness of from 150 μm to 500 μm, a light emitting element mounted on an upper surface of the submount, and a bonding part having an interposed portion between the submount and the base, and an extended portion arranged outside of the submount in a plan view, at least a part of the extended portion being two tiered including an upper tier and a lower tier. In a cross section, an outermost point of the upper tier is located outward from and above a connection point between the upper tier and the lower tier, and an apex of the upper tier is distant from a lateral face of the submount.

According to the present disclosure, in manufacturing a device such as a light emitting device, a component can be bonded in a stable manner. The present disclosure can provide a device such as a light emitting device with stable quality.

DETAILED DESCRIPTION

Figure 1:
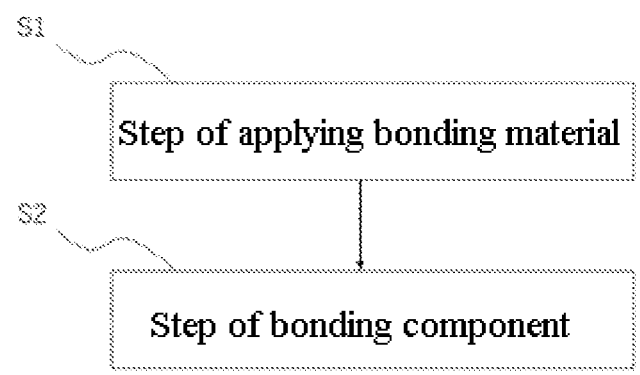
FIG. 1 is a flowchart of a bonding method according to an embodiment of the present disclosure.

In the description or the scope of claims herein, when describing a structure or shape as a polygonal shape, such as a triangle, quadrangle, or the like, any of those shapes subjected to processing such as cutting angles, chamfering, beveling, rounding, or the like will be included to that being referred to as a polygon. Similarly, a polygonal shape subjected to processing not only at a corner (one end of a side), but also in the intermediate portion of a side will also be referred to as a polygonal shape. In other words, any polygon-based shape subjected to processing is included in the interpretation of a "polygon" disclosed in the description and the scope of claims herein.

This applies to not only polygons, but also any word that describes a specific shape, such as a trapezoidal, circular, recessed, or projected shape. This also applies when handling each side of a shape. In other words, even if a side is subjected to processing at a corner or in the intermediate portion, the interpretation of a "side" includes the processed portion. In the case of distinguishing a "polygon" or "side" that has been intentionally not processed from a processed shape, it will be expressed with the word, "exact," added thereto, for example, an "exact quadrangle."

In the description or the scope of claims herein, expressions such as upper/lower, right/left, front/rear, forward/rearward, foreground/background, and the like merely describe the relationships among the constituent elements, such as their relative positions, orientations, or directions of the constituent elements, and do not need to match the relationships of such in use.

Certain embodiments of the present disclosure will be explained below with reference to the drawings. The embodiments described below are provided to give shape to the technical ideas of the present invention, and are not intended to limit the present invention. In the explanation below, the same designations and reference numerals denote the same or similar members, for which a redundant explanation will be omitted as appropriate. The sizes of and relative positions of the members shown in the drawings might be exaggerated for clarity of explanation.

Bonding Method According to Embodiment

Figure 2A:
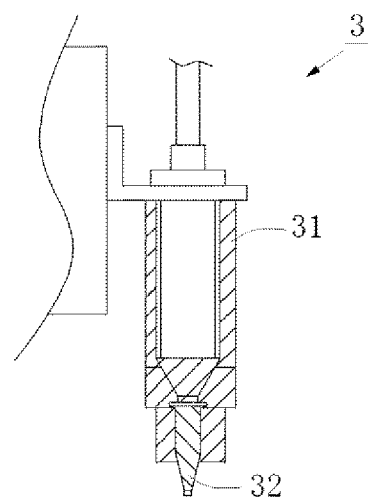
FIG. 2A is a schematic diagram of a bonding machine according to the embodiment.
Figure 2B:
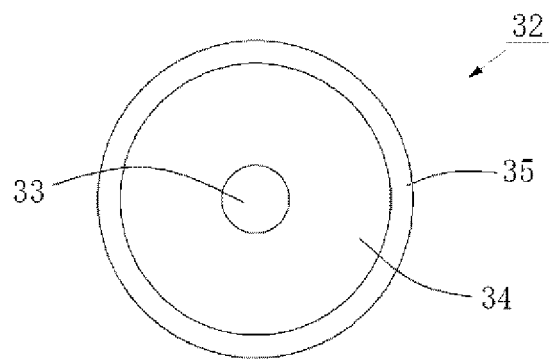
FIG. 2B is a plan view of a nozzle of the bonding machine according to the embodiment.
Figure 2C:
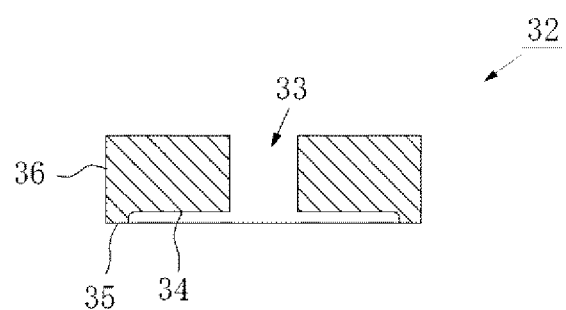
FIG. 2C is a cross-sectional view of the nozzle of the bonding machine according to the embodiment.

A bonding method used to mount a component on a base in manufacturing a device such as a light emitting device according to an embodiment will be explained. FIG. 1 is a flowchart of the bonding method. FIG. 2A is a schematic diagram of a bonding machine. FIG. 2B is a plan view of the nozzle portion of the bonding machine. FIG. 2C is a cross-sectional view of the nozzle portion of the bonding machine. FIGS. 3A to 3I are supplementary diagrams explaining each step of the bonding method according to the embodiment. FIGS. 4A and 4B are lateral side views showing how a component is bonded to a base by the bonding method according to the embodiment.

A method of bonding a component 1 according to an embodiment includes a step of applying a bonding material (step S1) and a step of bonding the component (step S2). A bonding material 2 is applied onto a base 10 by the step of applying a bonding material S1, and a component 1 is bonded to the base 10 by step of bonding the component S2.

A component 1 is a member to be mounted, and is, for example, a light emitting element in manufacturing a light emitting device. A base 10 has a mounting face where the component 1 is to be mounted, and is, for example, a flat sheet shaped substrate. A bonding material 2 is a material that bonds the component 1 to the base 10. A bonding machine 3 is utilized to apply the bonding material 2.

Bonding Machine 3

As illustrated in FIGS. 2A to 2C, a bonding machine 3 has a syringe 31 and a nozzle 32. In the syringe 31, a bonding material 2 is supplied. The bonding material 2 in the syringe 31 is dispensed through the nozzle 32 as the amount to be dispensed is controlled by the drive circuit of the bonding machine 3. The syringe 31 can hold at least 1 ml of the bonding material 2.

Nozzle 32

The leading end of the nozzle 32 has a dispensing part 33, an enclosing part 34, a leading end face 35, and one or more outer lateral faces 36. The bonding material 2 filling the syringe 31 is dispensed from the leading end of the nozzle 32. For the bonding material 2, a paste material composed of a resin and an organic solvent in which metal particles are dispersed can be employed.

Examples of the paste materials include metal paste materials, such as Au paste and Ag paste. Other examples include epoxy-based or silicone-based resin paste materials. For the bonding material 2, one having a viscosity of 10 Pa·s to 150 Pa·s can be used. In the bonding machine 3 shown in the drawing, an Au paste material having a viscosity of 40 Pa·s to 70 Pa·s is employed as the bonding material 2.

An outlet is formed in the dispensing part 33 through which the bonding material 2 in the syringe 31 is dispensed. In the dispensing part 33, one or more outlets can be formed. The bonding machine 3 shown in the drawing has one outlet, but it may have multiple outlets.

The outlet is circular in a plan view. The shape is not limited to a circle, and may be an ellipse or quadrangle. In a plan view, the maximum length of the outlet is 0.05 mm to 0.5 mm. In a plan view, the output area is 0.002 mm$^2$ to 0.2 mm$^2$. This allows the outlet to apply the bonding material 2 to have a suited shape (shape and size). The maximum length and area of the outlet are not limited to the above-described ranges.

Although the details will be described later, the thickness of the bonding material 2 is larger in the region directly under the outlet among the area onto which the bonding material 2 is applied than in the peripheral region 21. The central region 22 of a coating face in which the thickness of the bonding material 2 applied is relatively larger can be considered as the region directly under the outlet. Depending on the properties such as the viscosity of the bonding material 2, there can be a slight difference between the central region 22 and the region directly under the outlet. In any case, the shape of the outlet can form the central region 22 to have a suited shape.

The enclosing part 34 has one or more enclosing faces for applying the bonding material 2 dispensed through the outlet in a predetermined shape. In a plan view, the outlet is enclosed by the enclosing part 34. When the bonding material 2 is applied to a surface, the bonding material 2 dispensed through the outlet is enclosed by the one or more enclosing faces of the enclosing part 34 and the coated surface to which the bonding material 2 is applied.

The outline of the enclosing part 34 formed by the one or more enclosing faces is circular. The outline of the enclosing part 34 is not limited to a circle, and may be an ellipse or quadrangle. The maximum length of the outline of the enclosing part 34 is 0.5 mm to 2 mm. The area within the outline of the enclosing part 34 is 0.2 mm$^2$ to 3.14 mm$^2$. This can suitably shape the outline of the bonding material 2 applied. The maximum length and the area of the outline of the enclosing part 34 are not limited to these ranges.

When applying the bonding material 2, the bonding material 2 dispensed from the outlet extends beyond the outline of the enclosing part 34. The outline of the bonding material 2 applied to the coated surface can have the shape that corresponds to the outline of the enclosing part 34. In other words, the outline of the bonding material 2 applied to a surface can be the same as or approximately the same as the outline of the enclosing part 34. The shape of the bonding material 2 can be made smaller than the outline of the enclosing part 34.

For example, a nozzle 32 in which the outline of the enclosing part 34 and the shape of the outlet are circles of 0.5 mm and 0.1 mm in diameter, 0.9 mm and 0.2 mm in diameter, or 1.1 mm and 0.3 mm in diameter, respectively, can be used. The nozzle 32 is not limited to these examples.

The one or more enclosing faces include an opposing face that defines the outlet and opposes a coating face. The one or more enclosing faces also include an inner lateral face that meets the leading end face 35. In the enclosing part 34, the opposing face and the inner lateral face which form a curved corner can also be considered as one continuous face that connects the opposing face and the inner lateral face. The enclosing part 34 may have the shape in which the opposing face and the inner lateral face can be considered as separate faces that meet one another. In a plan view, the central position of the outline of the enclosing part 34 overlaps the outlet.

The leading end face 35 is the face that comes closest to a coating face when dispensing the bonding material 2. The leading end face 35 surrounds the enclosing part 34. The leading end face 35 is annular in shape. The inner edge and the outer edge of the leading end face 35 are circular in shape. Alternatively, the inner edge and the outer edge of the leading end face can be other shapes such as a rectangle as shown in FIG. 3I. The inner edge of the leading end face 35 coincides with or approximately coincides with the outline of the enclosing part 34. The leading end face 35 meets the outline of the enclosing part 34.

The leading end face 35 is a flat face, and the dispensing part 33 and the enclosing part 34 are recessed inwardly from an imaginary plane that includes the leading end face 35. Assuming that the leading end face 35 is the lower face of the nozzle 32, the dispensing part 33 and the enclosing part 34 are located above the imaginary plane that includes the leading end face 35. The dispensing part 33 and the enclosing part 34 are located above an imaginary plane that includes the inner edge of the leading end face 35. The dispensing part 33 and the enclosing part 34 are located above an imaginary plane that includes the outer edge of the leading end face 35.

The leading end face 35 is parallel to the opposing face of the enclosing part 34. The imaginary plane that includes the inner edge of the leading end face 35 is parallel to the opposing face of the enclosing part 34. The imaginary plane that includes the outer edge of the leading end face 35 is parallel to the opposing face of the enclosing part 34. In a plan view, the central position in the inner edge of the leading end face 35 overlaps the outlet. In a plan view, the central position in the outer edge of the leading end face 35 overlaps the outlet.

The maximum height from the imaginary plane that includes the leading end face 35, the inner edge of the leading end face 35, or the outer edge of the leading end face 35 to the opposing face of the enclosing part 34 is 20 µm to 80 µm. The maximum height set in this range allows the bonding material 2 to be applied in small thickness. Although the details will be described later, this can achieve the thickness of the bonding material 2 of 50 µm at most in the peripheral region 21 where the bonding material is thinly applied. The maximum height is not limited to this range, and can be set to be larger than 80 µm or smaller than 20 µm.

When applying the bonding material 2, the bonding material 2 dispensed through the outlet stops near or extends beyond the outer edge of the leading end face 35. Accordingly, the outline of the bonding material 2 applied to the coating face can have the shape that corresponds to the outer edge of the leading end face 35. In other words, the outline of the bonding material 2 applied can have the same shape as or approximately the same shape as the outline of the leading end face 35. The shape of the bonding material 2 applied can alternatively be made smaller than the outline of the leading end face 35.

The bonding machine 3 does not essentially require an enclosing part 34. In this case, the leading end face 35 defines the outlet in place of the otherwise present opposing face of the enclosing part 34. The leading end face 35 in such a bonding machine 3 configures the area that combines the leading end face 35 and the opposing face of the enclosing part 34. The leading end face 35 can also be considered as the opposing face.

Accordingly, if such a form is included, the maximum height of the opposing face of the enclosing part 34 from the imaginary plane that includes the leading end face 35, the inner edge of the leading end face 35, or the outer edge of the leading end face 35 to the opposing face of the enclosing part 34 in the bonding machine 3 is preferably larger than 0 µm, but not exceeding 80 µm, or 0 µm (i.e., without an enclosing part 34).

In a plan view, the outline of the one or more outer lateral faces 36 have the same shape as the outline of the enclosing part 34, and is larger than the outline of the enclosing part 34. The one or more outer lateral faces 36 meet the leading end face 35. In a plan view, the outline of the one or more outer lateral faces 36 matches the shape that combines the outline of the enclosing part 34 and the leading end face 35.

In a plan view, the width of the leading end face 35 can be one half of the value obtained by subtracting the maximum length of the outline of the enclosing part 34 from the maximum length of the outline of the outer lateral face(s) 36. The width of the leading end face 35 is preferably 0.05 mm to 0.5 mm. A width of 0.5 mm at most can suppress the shape of the bonding material 2 applied from varying. A width of at least 0.05 mm can maintain the strength of the leading end of the nozzle 32, reducing the likelihood of damage to the nozzle 32 that can be caused by the nozzle coming into contact with the base 10 or the like.

Bonding Method: Step of Applying Bonding Material

In the step of applying a bonding material S1, the nozzle 32 of the bonding machine 3 is placed at a predetermined coating position of the base 10 and the bonding material 2 is dispensed from the dispensing part 33. The coating position for the bonding material 2 is determined based on the position of a component 1 being placed and mounted on the base 10. In other words, in applying the bonding material 2 for fixing a component 1 to a predetermined position of the base 10, a predetermined position in the mounting face of the base 10 where the component 1 will be disposed, and the size and the shape of the bonding face of the component 1 that opposes the mounting face of the base 10 become the parameters for determining the coating position.

Figure 3A:
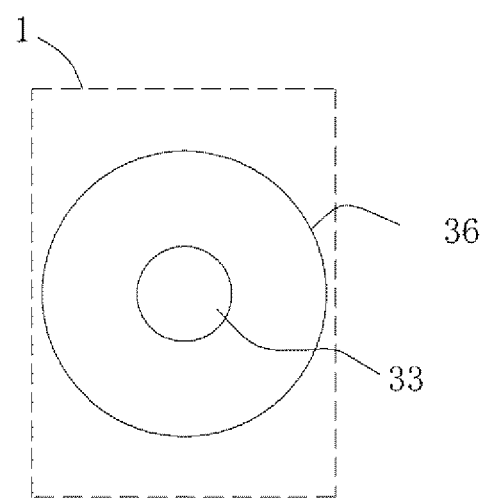
FIG. 3A is a top view explaining an example of the positional relationship between a position for a bonding material to be applied and a position for a component in the bonding method according to the embodiment.
Figure 3B:
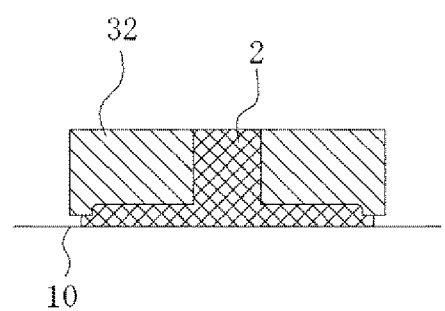
FIG. 3B is a cross-sectional view explaining an example of how a bonding material appears when being applied by the bonding machine in the bonding method according to the embodiment.
Figure 3C:
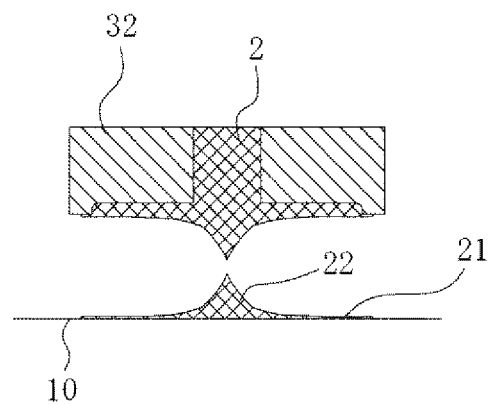
FIG. 3C is a cross-sectional view explaining an example of how a bonding material appears when applied to a base by the bonding machine in the bonding method according to the embodiment.
Figure 3D:
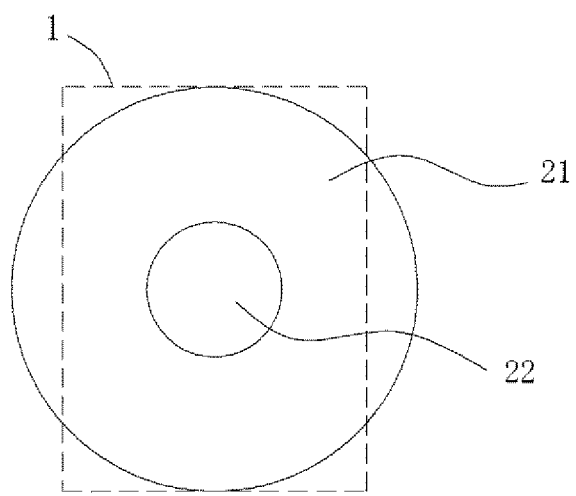
FIG. 3D is a top view explaining an example of how a bonding material appears when applied to a base by the bonding machine in the bonding method according to the embodiment.
Figure 4A:
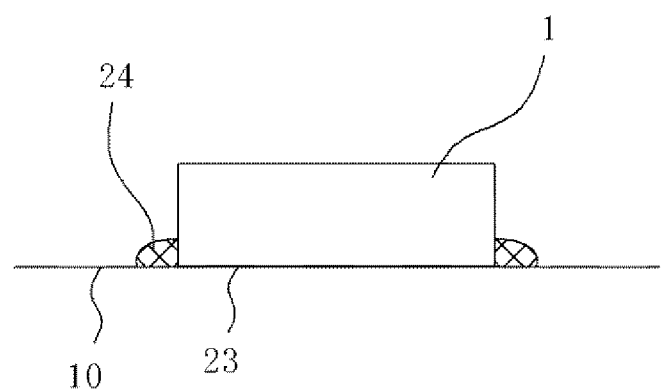
FIG. 4A is a lateral side view explaining an example of how a component appears when bonded to a base by the bonding method according to the embodiment.
Figure 4B:
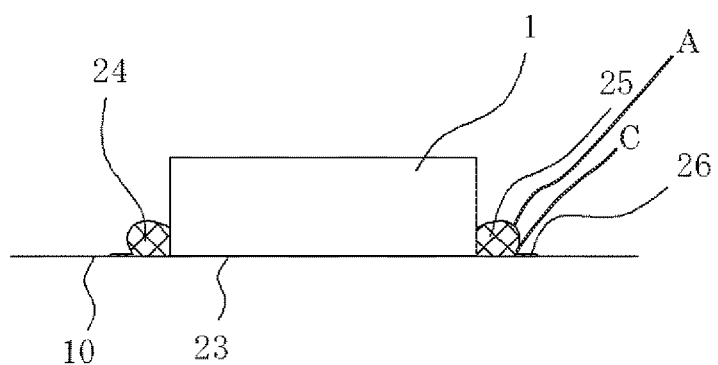
FIG. 4B is a lateral side view explaining another example of how a component appears when bonded to a base by the bonding method according to the embodiment.

As shown in FIG. 3A, in this step, the coating position for the bonding material 2 is determined based on the position where the bonding face of the component 1 will be mounted such that the outline of the leading end face 35 in a top view fits within the bonding face of the component 1. In other words, the outline of the leading end face 35 has the size and shape that fits within the bonding face of the component 1.

The bonding machine 3 preferably satisfies the condition that the area defined by the outline of the leading end face 35 is 75% to 100% of the area of the bonding face of a component 1. Satisfying this condition can secure a sufficient bonding area for the bonding material 2 to stably bond the component 1 even when the outline of the leading end face 35 fits within the bonding face of the component 1.

Furthermore, the coating position for the bonding material 2 is determined such that an imaginary straight line that crosses the outline of the leading end face 35 at two points and passes across the bonding face of the component 1 in a top view is present. The imaginary straight line preferably further satisfies the condition that the length (distance) between the two points of the outline of the leading end face 35 crossed by the straight line is 80% to 100% of the length of the bonding face of the component 1 crossed by the straight line. Satisfying this condition allows a portion of the bonding material 2 to extend beyond the bonding face of the component 1 after completing the bonding process. In this manner, the bonding condition can be confirmed. This can also reduce the amount of the bonding material 2 used for bonding a component.

These conditions based on the area ratio and the length ratio can be affected by the shape difference between the outline of the leading end face 35 and the bonding face of the component 1. For example, in the case in which the outline of the leading end face 35 is a circle and the bonding face of the component 1 is a rectangle having an aspect ratio of 0.4 to 1, either or both of the area ratio condition or/and the length ratio condition described above can be satisfied in the bonding method according to this embodiment.

The component 1 is not particularly limited as long as it is an object to be mounted on the base 10. Examples of the components to be mounted 1 include light emitting elements and submounts. Other examples include a reflecting member such as a mirror, an optical member such as a lens, or a light emitting device. In the examples related to the bonding method shown in the drawings, a submount with a light emitting element and having a rectangular bonding face to be bonded to the mounting face of the base 10 is employed as the component 1.

The area of the bonding face of a component 1 is 0.5 mm$^2$ to 3 mm$^2$. The height of the component 1 from the bonding face is 150 μm to 500 μm. In the bonding method according to the embodiment, stable bonding can be achieved by employing a component 1 that satisfies these conditions. Stable bonding can be achieved by the bonding method of the embodiment even when a component falls outside of these condition ranges.

Figure 3E:
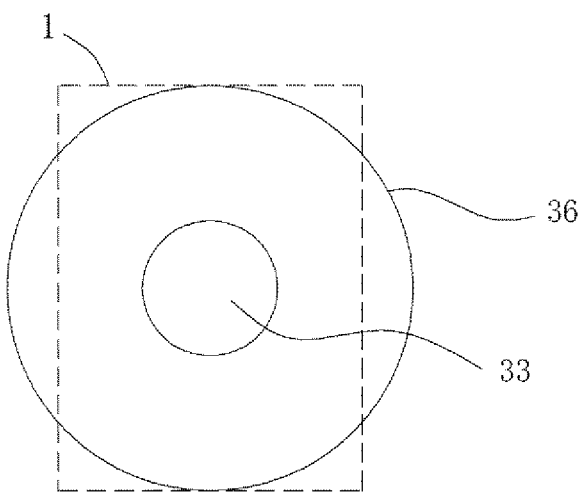
FIG. 3E is a top view explaining another example of the positional relationship between a position for a bonding material to be applied and a position for a component in the bonding method according to the embodiment.
Figure 3F:
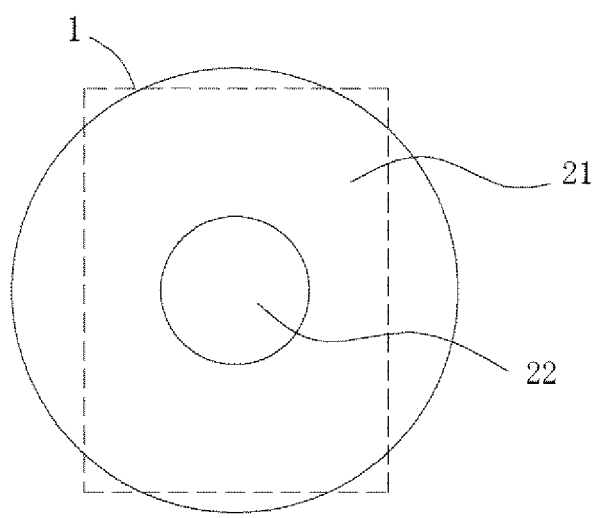
FIG. 3F is a top view explaining another example of how a bonding material appears when applied to a base by the bonding machine in the bonding method according to the embodiment.
Figure 3G:
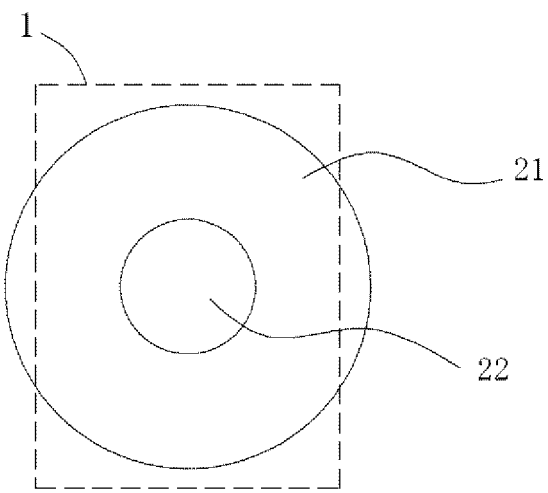
FIG. 3G is a top view explaining another example of how a bonding material appears when applied to a base by the bonding machine in the bonding method according to the embodiment.

As shown in FIG. 3E, the coating position for the bonding material 2 may be set so as to allow at least a portion of the outline of the leading end face 35 to extend beyond the outline of the component 1 in this step. The coating position for the bonding material 2 may be set such that the leading end face 35 extends beyond the outline of the component 1 at least at two opposing locations that interpose the component 1.

Hereinafter, the case in which the outline of the leading end face 35 does not extend beyond the bonding face of the component 1 and the case in which the outline of the leading end face 35 extends beyond the bonding face in the step of applying a bonding material S1 will simply be referred to as the "non-extending bonding method" and the "extending bonding method," respectively. Although the details will be described later, in either bonding method, the bonding material 2 applied to a surface may extend beyond the bonding face of the component 1 at least in part.

Figure 3H:
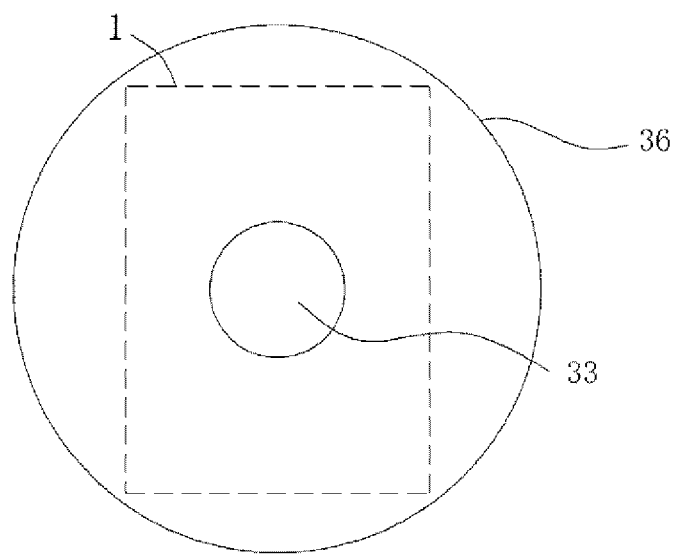
FIG. 3H is a top view explaining another example of the positional relationship between a position for a bonding material to be applied and a position for a component in the bonding method according to the embodiment.
Figure 3I:
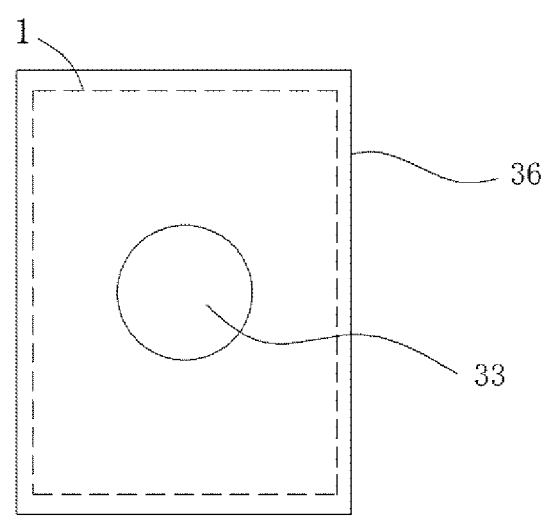
FIG. 3I is a top view explaining another example of the positional relationship between a position for a bonding material to be applied and a position for a component in the bonding method according to the embodiment.

In the extending bonding method, there can be a case in which the outline of the leading end face 35 is in size and shape to extend beyond the outline of the bonding face of the component 1 only in part, as shown in FIG. 3E, and a case in which the outline of the leading end face 35 extends beyond the outline of the bonding face of the component 1 in whole, as shown in FIGS. 3H and 3I. In either case, the component 1 can be stably bonded.

In the former case, with respect to the area ratio condition described above, the condition in which the area defined by the outline of the leading end face 35 is 80% to 200% of the bonding face of the component 1 is preferably satisfied. Satisfying this condition can secure a sufficient bonding area for the bonding material 2. Exceeding 200% might result in an excessively large coating area for the bonding material 2 applied to the mounting face of the base 10.

Furthermore, with respect to the length ratio condition described above, the length (distance) between the two points of the outline of the enclosing part 34 crossed by the imaginary straight line is preferably in excess of 100%, but not exceeding 120% of the length of the straight line across the bonding face of the component 1. Satisfying this condition can reduce the amount of the bonding material 2 used for bonding the component. Exceeding 120% might result in an excessively large coating area for the bonding material 2 applied to the mounting face of the base 10.

In the latter case, with respect to the area ratio condition described above, the condition in which the area defined by the outline of the leading end face 35 is in excess of 100%, but not exceeding 230% of the bonding face of the component 1 is preferably satisfied. Satisfying this condition can secure a sufficient bonding area for the bonding material 2. Exceeding 230% might result in an excessively large coating area for the bonding material 2 applied to the mounting face of the base 10.

Furthermore, with respect to the length ratio condition described above, the length (distance) between the two points of the outline of the enclosing part 34 crossed by the imaginary straight line is preferably in excess of 100%, but not exceeding 120% of the length of the bonding face of the component 1 crossed by the straight line. Exceeding 120% might result in an excessively large coating area for the bonding material 2 applied to the mounting face of the base 10.

Hereinafter, the extending bonding method based on the former case such as that shown in FIG. 3E will be explained unless otherwise specifically noted. The portion of the explanation of the former case that is based on FIG. 3H or 3I would also constitute the explanation based on the latter case.

In the case of the extending bonding method, the nozzle 32 of the bonding machine 3 has the size such that at least a portion of the outline of the leading end of the nozzle 32 extends beyond the bonding face of the component 1. The outline of the leading end of the nozzle 32 is larger than the bonding face of the component 1 in part or whole. Here, the outline of the nozzle 32 being larger than the bonding face in part means that the maximum length of the outline of the leading end of the nozzle 32 is larger than the bonding face of the component 1 at least in one direction. Alternatively, the minimum length of the bonding face of the component 1 is smaller than the length of the outline of the leading end of the nozzle 32 at least in one direction. "The outline of the leading end face 35" replacing "the outline of the leading end of the nozzle 32" can similarly be said to have the size that extends beyond the bonding face of the component 1. In the bonding machine 3 illustrated in the drawing, the outline of the leading end face 35 can be said to coincide with the outline of the leading end of the nozzle 32.

For example, in the case in which the bonding face of the component 1 is a rectangle and the outline of the leading end face 35 is a circle, the diameter of the outline of the leading end face 35 is larger than the short sides of the rectangle. The diameter is smaller than the long sides of the rectangle. The outline of the leading end of the nozzle 32 extends beyond the two opposing long sides of the bonding face of the component 1 at least in part. The diameter may be larger than the long sides of the rectangle. In this case, the diameter may be larger than the long sides of the rectangle. In this case, the outline of the leading end of the nozzle 32 extends beyond all four sides of the bonding face of the component 1 at least in part.

The bonding material 2 dispensed from the dispensing part 33 is supplied in the space between the mounting face of the base 10 and the enclosing part 34. Subsequently lifting up the bonding machine 3 allows the bonding material 2 to coat the mounting face of the base 10.

When the bonding machine 3 is lifted, the bonding material 2 applied onto the mounting face of the base 10 is larger than the outline of the leading end face 35. FIG. 3D and FIG. 3F show the sizes of the bonding material 2 applied onto the mounting face of the base 10 by the non-extending bonding method and the extending bonding method, respectively.

As shown in FIGS. 3D and 3F, the outline of the bonding material 2 is located on the outside of the outline of the leading end face 35. Furthermore, the bonding material 2 extends beyond the bonding face of the component 1 to be mounted on the base 10 at least in part. In other words, the bonding material 2 is applied onto the mounting face of the base 10 in size and shape to extend beyond the bonding face of the component 1 at least in part.

After setting the coating position for the bonding material 2 using the bonding machine 3 so as to allow the outline of the leading end face 35 to extend beyond the component 1 at least in part as shown in FIG. 3E, the bonding material 2 may be disposed to remain inward of the outline of the leading end face 35 as shown in FIG. 3G. The bonding material 2 is applied in size and shape to extend beyond the bonding face of the component 1 to be mounted on the base 10 at least in part even in this case.

In the non-extending bonding method, the outline of the bonding material 2 applied while setting the outline of the leading end face 35 to fit within the bonding face of the component 1 extends beyond the bonding face of the component 1 at least in part when the bonding machine 3 is lifted. In other words, in the non-extending bonding method, the bonding material 2 is dispensed such that the bonding material 2 applied onto the mounting face of the base 10 extends beyond the bonding face of the component 1 at least in part when separated from the bonding machine 3.

The bonding material 2 applied to the mounting face of the base 10 has the shape in which the portion in the central region 22 directly under the outlet is raised. The raised portion is formed by lifting the bonding machine 3. The bonding material 2 applied to the base 10 has a portion in the peripheral region 21 that is flat, i.e., substantially constant in thickness, and a portion in the central region 22 surrounded by and raised as compared to the peripheral region 21.

The portion of the bonding material 2 in the peripheral region 21 can be formed to have a thickness (height) from the mounting face of the base 10 of smaller than 50 μm. The thickness of the portion in the peripheral region 21 is not limited to that smaller than 50 μm, and is preferably at least 5 μm, but under 80 μm. This can reduce the maximum height of the bonding material 2 when a component 1 is bonded.

The bonding material 2 in the central region 22 is located closer to the center than the portion in the peripheral region 21. The central region 22 is surrounded by the peripheral region 21. The central region 22 in a top view is in size and shape that fits within the bonding face of the component 1.

The thickness (height) in the central region 22 from the mounting face of the base 10 is larger than in the peripheral region 21. The maximum thickness in the central region 22 is at least 100 μm. This allows the bonding material 2 in the central region 22 to sufficiently extend out. The maximum thickness in the central region 22 may be smaller than 100 μm.

The maximum thickness in the central region 22 is preferably larger than the maximum thickness in the peripheral region 21 by at least 50 μm. When the thickness difference between the central region 22 and the peripheral region 21 is small, the bonding material 2 in the central region 22 might not sufficiently extend beyond the bonding face, which makes it difficult to confirm that the bonding condition is stable.

Bonding Method: Step of Bonding Component

In the step of bonding the component S2, a component 1 is placed in a predetermined position of the mounting face of the base 10 from above the mounting face of the base 10. Because the component 1 is located above the mounting face of the base 10, the bonding material 2 in the central region 22 is covered by the component 1 while a portion of the bonding material 2 is extended beyond the outline of the component 1 in part in a top view.

The bonding material 2 applied to the base 10 is interposed between the mounting face of the base 10 and the bonding face of the component 1 and pressed down. The pressing allows at least a portion of the bonding material 2 to extend beyond the bonding face of the component 1. In other words, a portion of the bonding material 2 is already extended beyond the bonding face of the component 1 following the step of applying a bonding material S1, but a further portion of the bonding material 2 will extend beyond the bonding face of the component 1 in the step of bonding the component S2.

The portion of the bonding material 2 in the central region 22 is pushed outwardly. A portion of the bonding material in the central region 22 flows out and extends beyond the component 1 in a top view. The outline of the pressed bonding material 2 will be defined on the outside of the outline of the peripheral region 21 of the bonding material 2 defined by the step of applying a bonding material S1. The bonding material 2 is hardened in this extended condition to thereby bond the component 1 to the base 10.

Because the bonding material 2 even before being pressed is in size and shape such that at least a portion in the peripheral region 21 extends beyond the bonding face of the component 1, after being pressed, the bonding material 2 applied in the peripheral region 21 and the bonding material 2 applied in the central region 22 both extend beyond the component 1.

After being pressed, the bonding material 2 extends from at least 50% of the outline the bonding face of the component 1. Here, at least 50% accounts for the extended portion created by pressing, not taking the portion already extended before being pressed into consideration. The bonding material 2 preferably extends from at least two thirds of the outline of the bonding face of the component 1 after being pressed. The degree of bonding can be determined based on the degree of extension, and in confirming that a component is adequately bonded in this manner, the larger the percentage of the outline from which the bonding material 2 extends, the easier it is to determine that the bonding is stable.

In the non-extending bonding method, when comparing the state prior to pressing the bonding material 2 and the state in which the component 1 is bonded to the base 10, the proportion of the bonding material 2 extending from the outline of the bonding face of the component 1 is larger after the component is bonded. The bonding material 2 is allowed to extend from at least two sides of the quadrangular bonding face of the component 1 in the state in which the bonding material 2 is extended beyond after being pressed or the component 1 is bonded to the base 10. The two sides preferably are those that oppose one another. The bonding material may be allowed to extend from three or four sides.

In the extending bonding method, when comparing the state prior to pressing the bonding material 2 and the state in which the component 1 is bonded to the base 10, the proportion of the bonding material 2 extending from the outline of the bonding face of the component 1 is the same or larger after the component is bonded. The bonding material 2 is allowed to extend from at least two sides of the quadrangular bonding face of the component 1 in the state in which the bonding material 2 is extended beyond after being pressed or the component 1 is bonded to the base 10. The two sides preferably are those that oppose one another. The bonding material may be allowed to extend from three or four sides.

The bonding material 2 can simply be applied so as to extend from more sides of the quadrangular bonding face of the component 1 in the state in which the component 1 is bonded to the base 10 than in the state prior to pressing the bonding material 2.

Here, the portion extending beyond the bonding face of the component 1 in a top view will be referred to as the extended portion 24 of the bonding material 2. The portion of the bonding material 2 interposed between the base 10 and the component 1 without extending beyond the bonding face of the component 1 will be referred to as the interposed portion 23.

When a bonding material 2 having a viscosity of 40 Pa·s to 120 Pa·s is used, the extended portion of the bonding material 2 will have a shape that bulges outwardly. The outwardly bulging shape could result with a bonding material 2 having a viscosity outside of the 40 Pa·s to 120 Pa·s range.

In the state in which the component 1 is bonded to the base 10, the extended portion 24 of the bonding material 2 is in contact with the lateral faces that meet the bonding face of the component 1. The highest edge of the bonding material 2 from the mounting face of the base 10 is located outward from the lateral faces of the component 1. In other words, the highest edge is at a position distant from the lateral faces of the component 1. The highest edge of the bonding material 2 that is from the mounting face of the base 10 and is at a location in contact with a lateral face of the component 1 is lower than the highest edge of the extended portion 24 of the bonding material 2.

In the state in which a component 1 is bonded to the base 10 or the bonding material 2 is hardened, the bonding material 2 has a shape such as that shown in FIG. 4A or 4B. Here, each shape will be explained.

FIG. 4A is a lateral side view showing an example of the state in which a component 1 is bonded to a substrate 10. FIG. 4A shows the case of bonding the component 1 to the base 10 such that the outline of the extended portion 24 of the bonding material 2 flowed out beyond the bonding face resulting from the step of bonding the component S2 is located on the outside of the outline of the bonding material 2 resulting from the step of applying a bonding material S1. In this case, in appearance, the extended portion 24 of the bonding material 2 has a one-tier shape.

Such a shape of the bonding material 2 is formed when bonding the component by using the non-extending bonding method. It can also be formed by bonding a component by using the extending bonding method.

The extended portion 24 of the bonding material 2 includes the bonding material 2 applied in both the peripheral region 21 and the central region 22 in the step of applying a bonding material S1. The maximum distance from the bonding face of the component 1 to the outer edge of the extend portion 24 of the bonding material 2 is larger than, but not exceeding five times, preferably not exceeding three times, the maximum distance from the bonding face of the component 1 to the outline of the bonding material 2 as applied in the step of applying a bonding material S1. This can reduce the amount of the bonding material 2 to be applied.

FIG. 4B is a lateral side view of another example of the state in which a component 1 is bonded to the base 10. FIG. 4B shows the case of bonding the component 1 to the base 10 such that the outline of the extended portion 24 of the bonding material 2 flowed out of the bonding face resulting from the step of bonding the component S2 is located inward of the outline of the bonding material 2 resulting from the step of applying a bonding material S1. In this case, in appearance, the portion of the bonding material 2 arranged beyond the bonding face of the component 1 has a two tiered shape.

Such a shape of the bonding material 2 is formed when the component is bonded by using the extending bonding method. It can also be formed by using the non-extending bonding method.

The lower tier 26 of the two tiered portion of the bonding material 2 includes the bonding material 2 applied in the peripheral region 21, but not the bonding material applied in the central region 22 during the step of applying a bonding material S1. Accordingly, the thickness of the lower tier 26 of the two tiered portion equals the thickness in the peripheral region 21. Here, being equal tolerates the thickness fluctuations that can result from hardening the bonding material 2.

The upper tier 25 of the two tiered portion includes the bonding material 2 applied in the peripheral region 21 and the central region 22 during the step of applying a bonding material S1, and flowed out during the step of bonding a component S2. The maximum height of the upper tier 25 of the two tiered portion from the mounting face of the base 10 is 2 to 20 times the maximum height of the lower tier 26 of the two tiered portion from the mounting face of the base 10.

In a cross section, the outermost edge or the outermost point of the upper tier 25 of the two tiered portion is located outward from and above the location (the connection point C) where the upper tier 25 meets the lower tier 26. The highest edge (the apex A) of the upper tier 25 is distant from the lateral faces of the component 1. The connection point C where the upper tier 25 meets the lower tier 26 can be considered as the location where the bonding material 2 applied in the peripheral region 21 during the step of applying a bonding material S1 meets the bonding material 2 extended during the step of bonding a component S2.

The distance from an imaginary plane which includes a lateral face of the component 1 with which the upper tier 25 of the two tiered portion is in contact to the outermost (i.e., farthest) edge of the lower tier 26 of the two tiered portion in the direction perpendicular to this plane is larger than, but not exceeding three times, preferably not exceeding 1.5 times, the distance to the outermost (i.e., farthest) edge of the upper tier 25 of the two tiered portion in the direction perpendicular to the plane. This can reduce the degree of extension of the upper tier 25 relative to the degree of extension of the lower tier 26 of the two tiered portion.

Figure 5A:
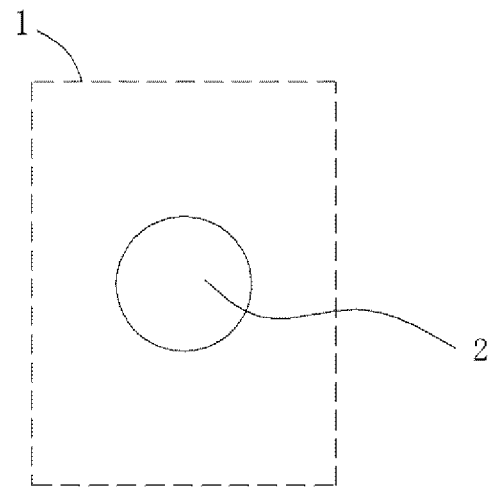
FIG. 5A is a top view explaining an example of how a bonding material appears when applied to a base by a bonding machine in a conventional bonding method.
Figure 5B:
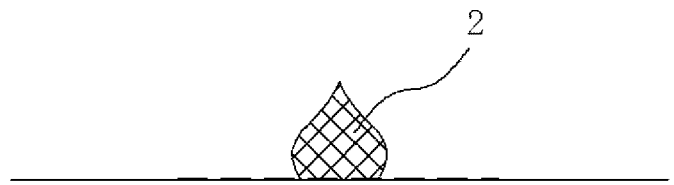
FIG. 5B is a cross-sectional view explaining an example of how a bonding material appears when applied to a base in the conventional bonding method.
Figure 5C:
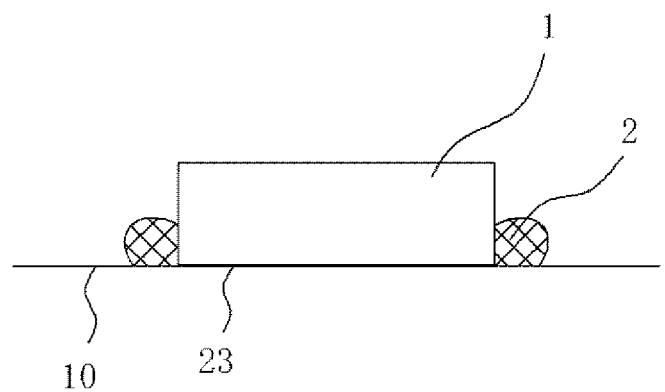
FIG. 5C is a lateral side view explaining an example of how a component appears when bonded to a base in the conventional bonding method.

The bonding method according to the embodiment will now be explained in comparison with a conventional bonding method. A conventional bonding method will be explained first. FIGS. 5A to 5C are diagrams explaining the shape of the bonding material 2 applied by the conventional bonding method. FIG. 5A is a top view showing the coating area for the bonding material 2 relative to a component 1 that will be bonded to the base 10. FIG. 5B is a cross-sectional view showing the shape of the bonding material 2 applied onto the base 10. FIG. 5C is a lateral side view showing the state in which the component 1 is bonded to the base 10 by the conventional bonding method.

As shown in FIG. 5A, with the conventional bonding method, the bonding material 2 is applied only in the central region 22. The bonding material 2 is applied well within the outline of the bonding face of the component 1. As shown in FIG. 5B, with the conventional bonding method, the bonding material 2 is applied in the shape of a liquid drop in the central region 22. As shown in FIG. 5C, the bonding material 2 is hardened in the state of being compressed by the component 1 while extending a portion thereof from the component 1.

As described above, in the conventional bonding method, the process for applying a bonding material 2 does not take into consideration the shape of the bonding face of a component 1 in order to cover a sufficient area of the bonding face. This therefore tends to increase the amount of a bonding material required as compared to the bonding method according to the embodiment.

For example, one method of determining that the component 1 is stably bonded to the base 10 by the bonding material 2 is confirming that the bonding material 2 extends out from the component 1. In employing this determination method, in order to reduce bonding failures, the amount of the bonding material 2 to be applied needs to be adjusted beforehand such that the bonding material 2 extends out from the component 1.

In making this adjustment, one must take into consideration that the amount of a bonding material 2 applied by a bonding machine can vary. One must also take in account that the bonding material 2 does not necessarily spread and extend out in the same direction or amount at all times because how the pressing force works on the bonding material 2 can vary. The impact of these would increase if the distance over which the bonding material 2 spreads in order to extend out from the component 1 is large as in the case of the conventional bonding method. Accordingly, the bonding method according to the embodiment can reduce the amount of the bonding material 2 to be applied as compared to the conventional bonding method.

Figure 6:
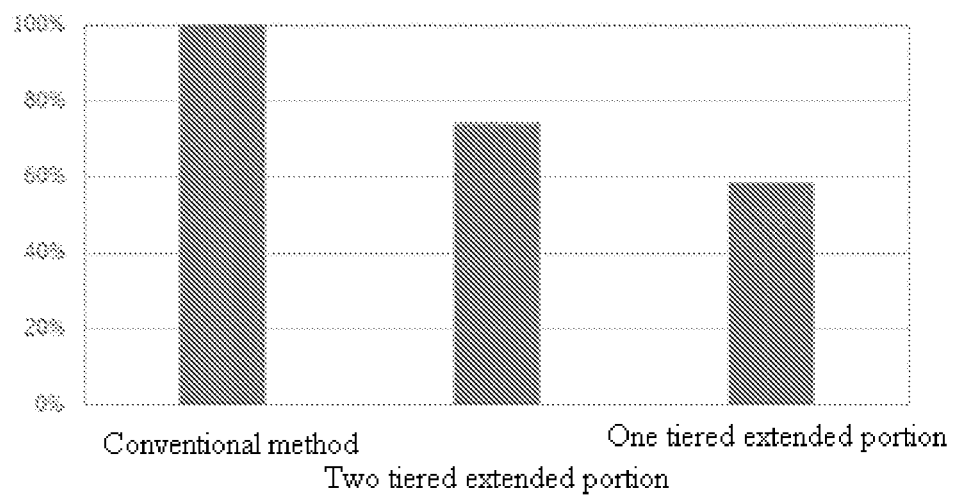
FIG. 6 is a graph comparing the amounts of a bonding material required by the conventional bonding method and the bonding method according to the embodiment.
Figure 7A:
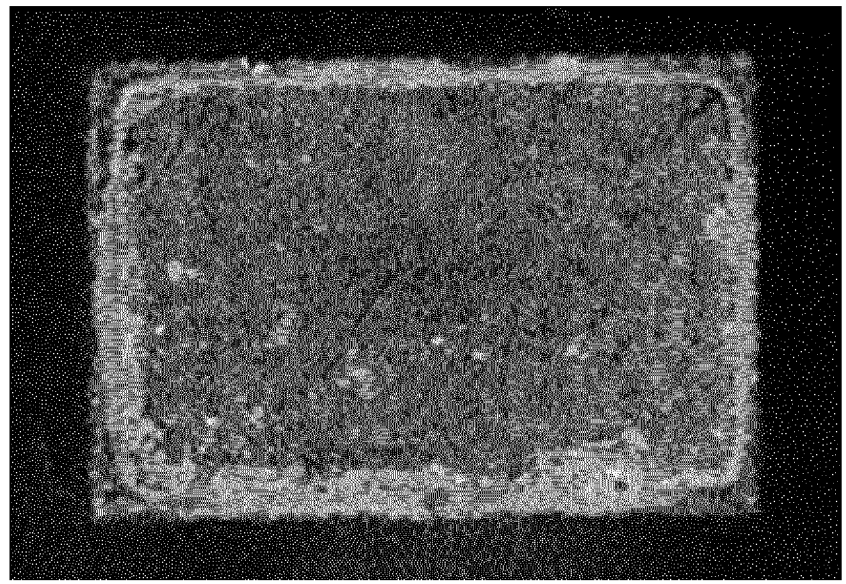
FIG. 7A is an image showing an example of how the base appears after detaching a component which was stably bonded.
Figure 7B:
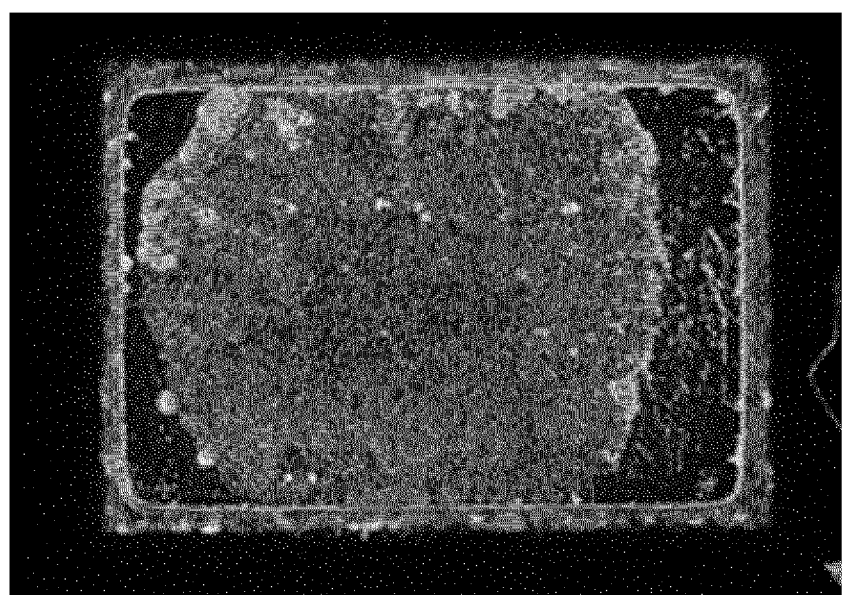
FIG. 7B is an image showing an example of how the base appears after detaching a component which was not stably bonded.

FIG. 6 shows the results of the comparison of the amounts of the bonding material required to secure the stable bonding strength. In determining the stable bonding strength, the two conditions described below were used, and if the two conditions were satisfied, it was determined to have achieved the stable bonding strength. The first condition was determined as satisfied if a force with which a component 1 was detached from a substrate 10 when the force was applied from the lateral side of the component 1 was at least a predetermined threshold value. The threshold value can be suitably set, and for this determination it was set at 2 kgf. The second condition was determined as satisfied if the bonding material 2 was observed across the entire bonding face and the entire mounting face when the component 1 was detached from the base 10. FIG. 7A shows an example in which this condition is satisfied, and FIG. 7B shows an example in which this condition is not satisfied.

As is understood from FIG. 6, the amount of the bonding material 2 required by the bonding method according to the embodiment was reduced by about 40% for the one tiered, and by more than 20% for the two tiered extended portions, as compared to the conventional method. As such, the bonding method according to the embodiment can stably bond a component with a smaller amount of the bonding material than that required by the conventional bonding method.

Figure 8A:
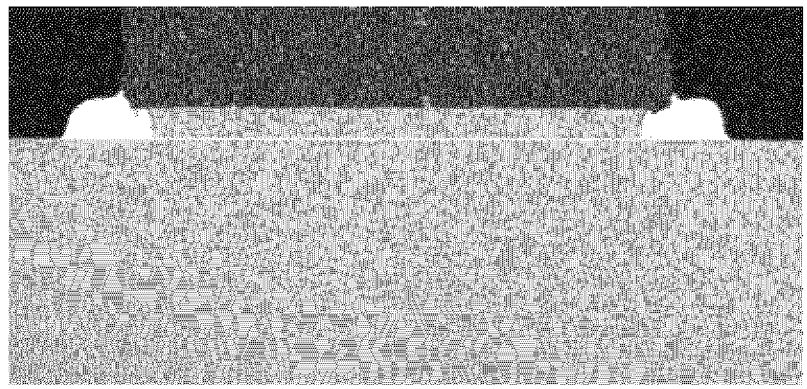
FIG. 8A is an image showing an example of the state of bonding achieved by the bonding method according to the embodiment.
Figure 8B:
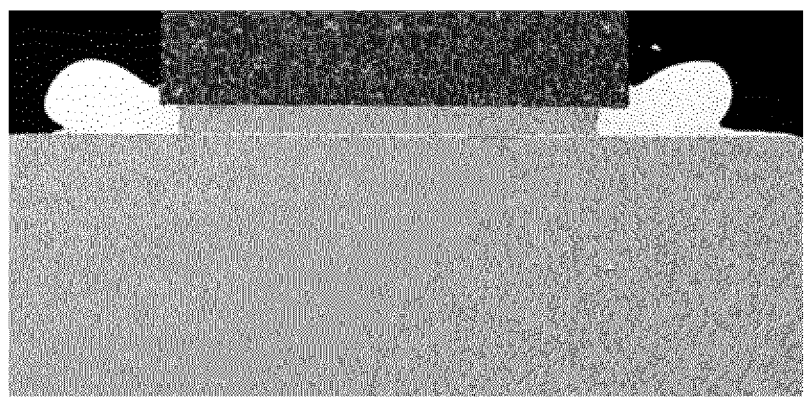
FIG. 8B is an image showing another example of the state of bonding achieved by the bonding method according to the embodiment.
Figure 8C:
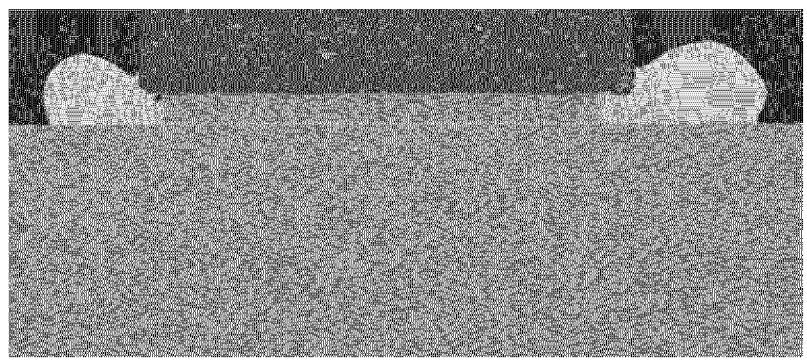
FIG. 8C is an image showing an example of the state of bonding achieved by the conventional bonding method.

A difference from the conventional bonding method can be seen not only in the amount of the bonding material 2, but also the shape of the bonding material 2 in the state in which a component 1 is bonded. FIG. 8A is an image of an example in which a component 1 is bonded to a base 10 by using the non-extending bonding method. FIG. 8B is an image of an example in which a component 1 is bonded to a base 10 by using the extending bonding method. FIG. 8C is an image of an example in which a component 1 is bonded to a base 10 by using the conventional bonding method.

Comparing FIGS. 8A and 8C, a difference can be found in the shape of the extended portion 24 of the bonding material 2. The bonding method according to the embodiment, which can reduce the amount of the bonding material 2 required, can reduce the height of the portion of the bonding material 2 that extends beyond the bonding face of the component 1.

With the conventional method, the maximum height of the extended portion of the bonding material 2 was larger by 150 μm to 200 μm than the height of the portion of the bonding material 2 in contact with the lateral faces of the component 1. With the non-extending bonding method according to the embodiment, the maximum height of the extended portion of the bonding material 2 was larger by a smaller amount, 80 μm to 120 μm, than the height of the portion of the bonding material 2 in contact with the lateral faces of the component 1.

It can be understood from FIG. 8B that the bulge in the extended portion 24 of the bonding material 2 is more distant (outward) from the lateral faces of the component 1 as compared to that shown in FIG. 8C. This is believed to have resulted as the portion of the bonding material 2 in the central region 22 spread outwardly over the lower tier of the two tiered bonding material 2 which had been formed by the step of applying a bonding material. In other words, it is considered easier for the bonding material 2 to spread over the same bonding material 2 than on the mounting face of the base 10.

Allowing the bonding material 2 to bulge more outwardly can reduce the maximum height of the extended portion of the bonding material 2. In other words, between the conventional bonding method and the extending bonding method of the embodiment, it can be said that if the maximum height of the extended portion of the bonding material 2 is the same, the distance from the component 1 to the maximum height point in the bonding material 2 is larger in the case of the extending bonding method of the embodiment.

Figure 9:
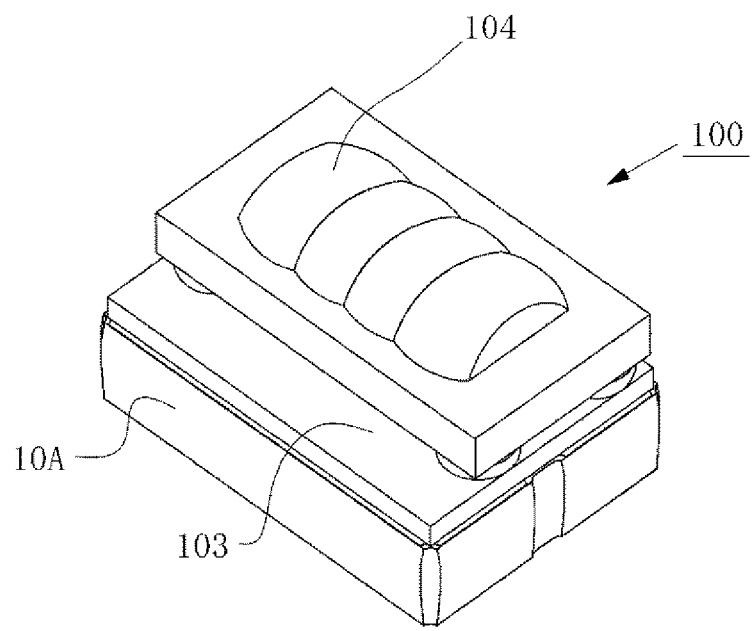
FIG. 9 is a perspective view of a light emitting device according to an embodiment.
Figure 10:
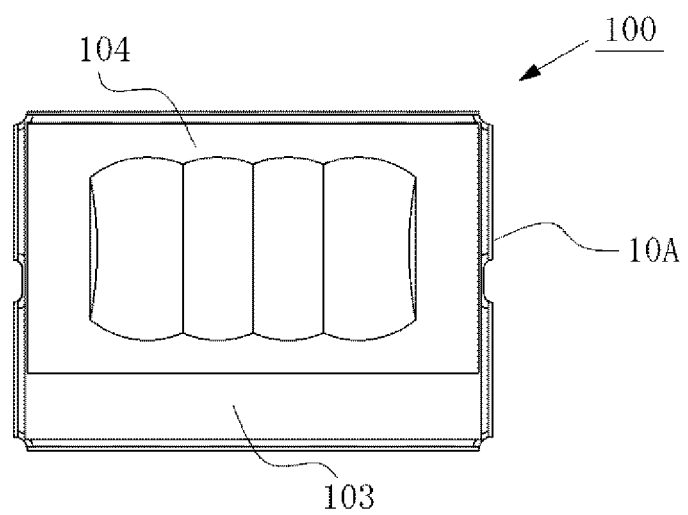
FIG. 10 is a top view of the light emitting device according to the embodiment.
Figure 11:
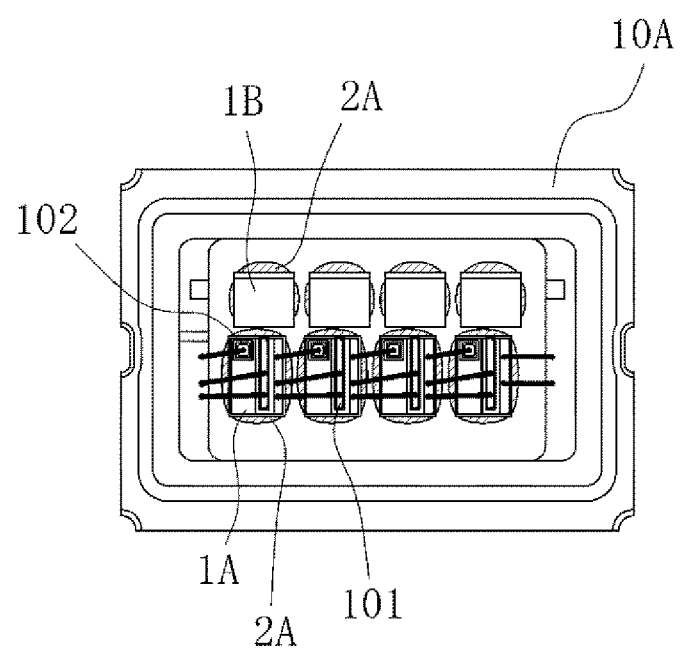
FIG. 11 is a top view explaining the internal structure of the light emitting device according to the embodiment.

Light Emitting Device Manufactured by Manufacturing Method According to Embodiment A light emitting device according to an embodiment will be explained next. The light emitting device according to the embodiment is manufactured by a manufacturing method that includes the bonding method described above. It can be said that a light emitting device is an example of a device subject to the device manufacturing method described above. FIG. 9 is a perspective view of a light emitting device 100, an example of a light emitting device according to the embodiment. FIG. 10 is a top view of the light emitting device 100. FIG. 11 is a top view of the light emitting device 100 in which certain constituent elements are not shown for the purpose of explaining the internal structure.

The light emitting device 100 includes a plurality of constituent elements including a base 10A, a plurality of light emitting elements 101, a plurality of submounts 1A, one or more light reflecting members 1B, a plurality of protective devices 102, a sealing member 103, and a lens member 104. The light emitting device 100 may have additional constituent elements.

Each constituent element will be explained next.

Base 10A

A base 10A has a base part and lateral side walls protruding upwardly from the base part. The base part and the lateral side walls create a recess, a space created inward of the lateral side walls. The base part has a mounting face, and the lateral side walls surround the mounting face. The base 10A is an example of the base 10 described with reference to the bonding method according to the embodiment.

The base 10A can be formed by using, for example, a ceramic material, such as silicon nitride, aluminum nitride, or silicon carbide. It can alternatively be formed by using a metal material, such as iron, iron alloy, or copper. The base 10A can alternatively be formed by joining the base part and the lateral side walls formed of different materials.

Light Emitting Element 101

A light emitting element 101 has a light emission face through which the light exits. For the light emitting element 101, for example, a semiconductor laser element can be employed. The light emitting element 101 has an upper face, a lower face, and one or more lateral faces. One of the lateral faces of the light emitting element 101 is the light emission face. The light emission face of the light emitting element 101 may be located in another face.

The peak emission wavelength of the light from the light emitting element 101 falls within the range of 320 nm to 530 nm, typically within the range of 430 nm to 480 nm. For such a light emitting element 101, for example, a semiconductor element which includes a nitride semiconductor can be employed. For the nitride semiconductor, for example, GaN, InGaN, and AlGaN can be used. The peak emission wavelength of the light from the light emitting element 101 is not limited to these wavelength ranges.

Submount 1A

A submount 1A is an example of the component 1 described with reference to the bonding method according to the embodiment. The submount has a lower face, an upper face, and one or more lateral faces. The lower face of the submount 1A serves as the bonding face. The up/down dimension of the submount 1A is the smallest of all dimensions. The submount 1A is a rectangular cuboid. The shape is not limited to a rectangular cuboid.

The submount 1A has a thickness of 150 μm to 500 μm. The submount 1A is formed by using, for example, silicon nitride, aluminum nitride, or silicon carbide. Other materials may be used. The conductive region of the submount 1A can be formed by disposing, for example, Ti/Pt/Au. The bonding region of the submount 1A can be formed by disposing, for example, Pt/AuSn in a portion of the region in which Ti/Pt/Au is disposed.

Light Reflecting Member 1B

A light reflecting member 1B has a bonding face and a light reflecting face oblique to the bonding face. The light reflecting face has a reflectance of at least 90% with respective to the peak wavelength of the irradiated light, for example. The reflectance here can be 100% at most or less than 100%.

Glass or a metal can be used as a primary material for forming the external part of the light reflecting member 1B. The primary material is preferably highly heat resistant, and for example, glass such as quartz or BK7 (borosilicate glass), metals such as aluminum, or Si can be used. The light reflecting face can be formed by using, for example, metals, such as Ag, Al or the like, or dielectric multilayer film, such as $Ta_2O_5/SiO_2$, $TiO_2/SiO_2$, $Nb_2O_5/SiO_2$, or the like. The primary material refers to the material having the largest proportion of all when multiple materials are used, or when a single material is used, the material itself.

Protective Device 102

A protective device 102 is a circuit element that prevents a certain element (e.g., light emitting element 101) from being broken by an excessive current flow. A typical example of a protective device 102 is a constant voltage diode, such as a Zener diode. For the Zener diode, for example, a Si diode can be used.

Sealing Member 103

A sealing member 103 has an upper face and a lower face. The sealing member 103 has light transmissivity across it from the upper face to the lower face. Having light transmissivity means a transmittance of at least 80% with respect to the major incident light.

The sealing member 103 may have light transmissivity in part. For example, the sealing member 103 may have a frame having no light transmissivity provided with one or more openings, and one or more light transmissive members that cover the one or more openings of the frame.

For the primary material for the sealing member 103, for example, a light transmissive material, such as glass, sapphire, or quartz can be used. A metal, for example, can be used as the primary material for the frame, and any of the light transmissive materials described above for the light transmissive member(s).

Lens Member 104

A lens member 104 has an upper face and a lower face. The lens member 104 has a plurality of lens faces. The lens faces are formed on the upper face side of the lens member 104. It can be said that the upper face of the lens member 104 is constructed with the lens faces incorporated therein. The portion forming each lens face in the lens member 104 will be referred to as a lens part.

The lens member 104 can have a plurality of lens faces arranged in an array. The lens member 104 can have a plurality of lens faces arranged in a matrix. The lens member 104 has at least two lens faces arranged side-by-side. The lens member 104 can be formed by using a light transmissive material, such as glass, synthetic quartz, or the like.

Light Emitting Device 100

A light emitting device 100 will be described next.

In the light emitting device 100, each of the light emitting elements 101 is mounted on a submount 1A. One or more light emitting elements 101 can be mounted on a submount 1A. In the light emitting device 100 illustrated in the drawings, a single light emitting element 101 is mounted on each of the submounts 1A.

In the light emitting device 100, the submounts 1A on which the light emitting elements 101 are mounted are arranged on the mounting face of the base 10A. The bonding face of each submount 1A is bonded to the mounting face of the base 10A via a bonding material 2 by the bonding method described above. In the light emitting device 100, a portion where the bonding material 2 is disposed will be referred to as a bonding part 2A.

In the light emitting device 100, by using the extending bonding method described above, for example, a two tiered bonding part 2A is formed in the similar manner illustrated in FIG. 4B. In a cross section taken along the imaginary line connecting the centers of two opposing sides of the quadrangular bonding face of a submount 1A in the light emitting device 100, the outermost points of the upper tier of the two tiered portion in the bonding material 2 are located outward from and above the connection points between the upper tier and the lower tier, and the apexes (the uppermost edges or the uppermost points) of the upper tier are distant from the lateral faces of the submount 1A.

In the light emitting device 100, a light reflecting member 1B is arranged on the mounting face of the base 10A. The bonding face of each of one or more light reflecting members 1B is bonded to the mounting face of the base 10A via the bonding material 2 by the bonding method described above. The light reflecting member 1B is disposed to face the light emission face of a light emitting element 101. The light reflecting members 1B can be arranged to respectively face the light emitting elements 101.

Because an array of the light emitting elements 101 and the respectively corresponding light reflecting members 1B are arranged in close proximity, using the bonding method described above which can reduce the amount of the bonding material 2 can suppress the bonding material 2 bonding the adjacent components to be mounted 1 from interfering one another. This can make it less likely for the closely located bonding material 2 to interfere and swell up which can, for example, cause a current leak or interrupt the light advancing towards the light reflecting faces. This can stabilize the quality of the light emitting device 100. This thus can provide devices such as light emitting devices with stable quality.

In the light emitting device 100, a protective device 102 is mounted on a submount 1A. A plurality of protective devices 102 are disposed to respectively correspond to the light emitting elements 101. Each protective device 102 is disposed in close proximity to the corresponding light emitting element 101.

In the light emitting device 100, the sealing member 103 is bonded to the base 10A. The lower face of the sealing member 103 is bonded to the upper face of the base 10A. A sealed space is created when the base 10A and the sealing member 103 are bonded together. The sealing member 103 is bonded using a method that is different from the bonding method described above. For example, the sealing member 103 is bonded to the base 10A by using AuSn solder.

The light emitting elements 101 are enclosed in the sealed space. Bonding the base 10A and the sealing member 103 under predetermined ambient conditions can create a hermetically sealed space. Enclosing the light emitting elements 101 in the sealed space can reduce dust adhering to the light emission faces of the light emitting elements 101, thereby suppressing the emission efficiency decline. The light reflected by the light reflecting members 1B passes through the sealing member 103.

In the light emitting device 100, the lens member 104 is located above the light emitting elements 101. The lens member 104 is located above the sealing member 103. The lens member 104 is bonded to the sealing member 103. The lens member 104 is bonded by using a different method from the bonding method described above. For example, the lens member 104 is bonded to the sealing member 103 by using a UV curable adhesive. The lens member 104 is disposed such that the light emitted from the individual light emitting elements 101 exits the light emitting device through the individual lens faces.

Certain embodiments of the present invention have been described above, but the present invention having the technological characteristics described in the specification is not limited to the structures described in the embodiments. For example, the present invention is applicable even to a light emitting device having a constituent element not disclosed in the embodiments, and such a difference from any of the disclosed structures does not constitute a ground for the inapplicability of the present invention. Moreover, it can be said from the standpoint of minimal elements that the elements of the light emitting devices disclosed by the embodiments could include an element that is not essential.

In other words, the light emitting devices disclosed by the embodiments in the specification reflect both the standpoint of completing an invention and the standpoint of disclosing a reasonable construction based on a conceivable application configuration. The application of an invention is not limited to the illustrated application configurations; on the other hand, it effectively works when applied to such an application configuration.

Accordingly, it is possibly unessential for the present invention (the claims) to recite all of the constituent elements disclosed in an embodiment. For example, in the event that a certain component of a light emitting device included in any of the disclosed embodiments is not recited in the claims, the claimed invention may still be applicable in view of the design flexibility of a person of ordinary skill in the art for such a component through the use of an alternative, an omission, a shape change, a change in the materials employed, or the like, without limiting to the components disclosed in the embodiments.

The bonding method disclosed by the embodiments described above can be incorporated in a manufacturing method employed to manufacture a device such as a light emitting device. The light emitting device described in the embodiment can be utilized in a projector. In other words, a projector is one of the application configurations to which the present invention is applied. The application of the present invention is not limited this, and can also be utilized as the light sources for lighting fixtures, automotive headlights, head mounted displays and backlights for other displays, and the like. The device disclosed by the embodiments can be a configuration other than a light emitting device, therefore, can be used as one other than a light source.

What is claimed is:

1. A light emitting device comprising:
a base;
a submount mounted on the base and having a thickness of from 150 μm to 500 μm;
a light emitting element mounted on an upper surface of the submount; and
a bonding part having an interposed portion between the submount and the base, and an extended portion arranged outside of the submount in a plan view, at least a part of the extended portion being two tiered including an upper tier body and a lower tier body, the lower tier body extending outwardly beyond the upper tier body, wherein
in a cross section, an outermost point of the upper tier body is located outward from and above a connection point between the upper tier body and the lower tier body, and an apex of the upper tier body is distant from a lateral face of the submount.

2. The light emitting device according to claim 1, wherein a maximum height of the upper tier body from the base is 2 to 20 times a maximum height of the lower tier body from the base.

3. The light emitting device according to claim 1, wherein in the cross section, the extended portion of the bonding part defines a reflex angle at the connecting point between the upper tier body and the lower tier body.

* * * * *